(12) United States Patent
Ji et al.

(10) Patent No.: US 8,697,518 B2
(45) Date of Patent: Apr. 15, 2014

(54) TRENCH MOSFET WITH TRENCH CONTACT HOLES AND METHOD FOR FABRICATING THE SAME

(75) Inventors: Gang Ji, Shanghai (CN); Jianping Gu, Shanghai (CN); Kaibin Ni, Shanghai (CN); Tianbing Zhong, Shanghai (CN)

(73) Assignee: Will Semiconductor Ltd., Shanghai (CN)

( * ) Notice: Subject to any disclaimer, the term of this patent is extended or adjusted under 35 U.S.C. 154(b) by 131 days.

(21) Appl. No.: 13/377,029

(22) PCT Filed: Jun. 4, 2010

(86) PCT No.: PCT/CN2010/073565
§ 371 (c)(1), (2), (4) Date: Dec. 8, 2011

(87) PCT Pub. No.: WO2010/142218
PCT Pub. Date: Dec. 16, 2010

(65) Prior Publication Data
US 2012/0091523 A1    Apr. 19, 2012

(30) Foreign Application Priority Data
Jun. 9, 2009   (CN) .......................... 2009 1 0052705

(51) Int. Cl.
*H01L 21/336* (2006.01)
(52) U.S. Cl.
USPC ................ 438/270; 257/330; 257/E29.262
(58) Field of Classification Search
USPC .............. 257/330, E29.262, E21.41; 438/270
See application file for complete search history.

(56) References Cited

U.S. PATENT DOCUMENTS

| 8,269,273 | B2* | 9/2012 | Hsieh | 257/331 |
| 2006/0273384 | A1 | 12/2006 | Hshieh | |
| 2007/0093077 | A1 | 4/2007 | Grivna | |
| 2007/0138523 | A1 | 6/2007 | Popp et al. | |
| 2008/0042222 | A1* | 2/2008 | Hshieh | 257/411 |
| 2011/0169075 | A1* | 7/2011 | Hsieh | 257/330 |
| 2011/0291185 | A1* | 12/2011 | Grover | 257/334 |

FOREIGN PATENT DOCUMENTS

| CN | 1941417 A | 4/2007 |
| CN | 1956153 A | 5/2007 |
| CN | 201181707 Y | 1/2009 |

OTHER PUBLICATIONS

Office Action issued in Chinese Patent Application No. 200910052705.7 dated Sep. 7, 2011 (with translation).
Written Opinion of the International Searching Authority issued in International Patent Application No. PCT/CN2010/073565 dated Sep. 2, 2010 (with translation).

(Continued)

*Primary Examiner* — Phuc Dang
(74) *Attorney, Agent, or Firm* — Oliff PLC

(57) ABSTRACT

A trench MOSFET with trench contact holes and a method for fabricating the same are disclosed. The MOSFET includes an N type substrate, an N type epitaxial layer on the substrate; a P well region on top of the epitaxial layer; a source region formed on the P well region; an oxide layer on the source region; a plurality of trenches which traverse the source region and the P well region and contact the epitaxial layer; a gate oxide layer and polysilicon formed in the trenches; a source contact hole and a gate contact hole, wherein the source contact hole and the gate contact hole have a titanium metal layer, a titanium nitride layer, and tungsten metal sequentially, respectively; a P+ implanted region; a source electrode formed above the source contact hole and a gate electrode formed above the gate contact hole.

8 Claims, 6 Drawing Sheets

(56) References Cited

OTHER PUBLICATIONS

International Search Report issued in International Patent Application No. PCT/CN2010/073565 dated Sep. 2, 2010 (with translation).

Office Action dated Feb. 4, 2013 issued in Chinese Application No. 2009100527057 (with translation).
Office Action dated Jun. 20, 2012 issued in Chinese Application No. 2009100527057 (with translation).

* cited by examiner

TRENCH MOSFET WITH TRENCH CONTACT HOLES AND METHOD FOR FABRICATING THE SAME

FIELD OF INVENTION

This invention relates to a trench MOSFET with trench contact holes and a method for fabricating the same.

BACKGROUND OF THE INVENTION

The trench power MOSFET (Metal Oxide Semiconductor Field Effect Transistor) is a power semiconductor device of a new generation, which has a fast switching speed, high input resistance and negative temperature coefficient. Compared with the VDMOS (vertical conductiondouble scattering metal oxide semiconductor), the trench power MOSFET can enable chips to be made in smaller size with low RDS(on) ensured; and it is widely used in high-frequency, medium and low power fields, such as electric vehicles, mobile phones, computer power supplies, and other products.

Because of miniaturization trends of modern electronic products, components are required to have smaller physical volumes, that is, package dimensions of devices are getting smaller and smaller. In order to ensure low RDS(on), the new trench MOSFET has used smaller unit cell pitches, and recently, the smallest unit cell pitch has been able to reach about 1.1 um. However, it also brings new requirements for the manufacturing process of a device: as unit cell pitches are reduced, the controllable range of the diffusion process used during the production of source blocks will become smaller and smaller, and it is likely to cause an imperfect contact between source contact holes and the substrate of a device, which affects the test performance of the device as well as the production yield.

At present, aiming at production methods of contact holes, the self-aligned effect of side walls of the gate electrode has been utilized in large scale integrated circuit processing production to produce trench contact holes to replace the conventional plane type contact holes (refer to FIG. 1). As the trench power MOSFET is of a longitudinal structure, the production process for trench contact holes in the large scale integrated circuit processing production is not suitable for the production methods of contact holes of the trench power MOSFET; meanwhile, there are similar production processes for trench contact holes in the prior art related to trench power MOSFET process, but the production process for the trench power MOSFET with the trench contact holes comprises six photolithographic procedures as blow:

Buried layer;
Active layer;
Source implantation;
Trench;
Contact holes; and
Metal.

Wherein the contact holes are relatively large-sized, the production process is generally suitable for those trench MOSFET devices with contact holes whose sizes are more than 0.6 um. As for the contact holes whose size are 0.3 um or less than 0.3 um, the contact holes will be filled imperfect due to the use of aluminum (Al) as a metal filling medium in the prior art, which causes the appearance of voids 100 as shown in FIG. 1 and non-uniform Al step coverage, etc. As a result, the trench power MOSFET device may have reliability problems in actual use, which directly affects the application function of the device.

The prior MOS transistor source block process has the following characteristics (suitable for large unit cell pitches: 0.6 um and above), as shown in FIG. 2:

The source electrode of the MOS transistor contacts both N+ source block 100,103 and P well region 101 through the source metal 102, and the P well region is connected with the source metal 102 through the P+ doping 104 for better ohm contact; as can be seen from FIG. 2, in order that the source metal 102 can contact with both the N+ source regions 100 and 103 and the P well region 101 well, the region inside p well that encircled by N+ source block ring must be ensured to have a dimension sufficient enough in the middle to prevent the N+ source regions 100 and 103 from colliding with each other and guarantee both the P well and the N+ source block contact the source metal 102 well during the subsequent thermal process. In addition, 'bowl-mouth-shaped' contact holes and 'hot aluminum' metal deposition process are usually used to ensure good metal coverage because that metal AlSiCu is directly filled. The above two factors (namely, the 'bowl-mouth-shaped' contact holes and the 'hot aluminum' metal deposition process) cause that the unit cell pitch of a single MOS transistor cannot be designed too small, usually said pitch is no less than 2 um.

Using metal material AlSiCu as an electrode has the following defects: due to the high solubility of silicon (Si) in aluminum (Al), a Al spiking can be readily formed in Si which causes a breakdown of PN junction. Although the breakdown can be prevented by adding 1% Si into Al, still, Si will readily form Si accumulation in Al which results in larger contact resistance and other adverse effects.

Using source block photolithography to control the spacing between adjacent source blocks has the following defects: in the case of the smaller unit cell, the horizontal diffusion of N+ impurities will be more difficult to control during the thermal process of the production of source blocks, so the ion implantation into the source region is typically replaced by implanting N+ ions into the entire 'source block island' surrounded by 'trenches'. However, the substrate P well will be completely isolated by the source region. If the process of contact hole as shown in FIG. 2 is still used, the P well will not be able to contact the source block, which causes undesirable ground connection, and thus deteriorates electric characteristics of the transistor.

SUMMARY OF THE INVENTION

The present invention intends to solve the technical problem on how to overcome the defects as follows: the contact holes are not well-filled, voids appear in the trenches and the breakdown of a PN junction easily occurs. To this end, a trench MOSFET device which is suitable for small size contact holes (less than 0.3 um) and a method for fabricating the same are provided.

The technical solutions of the present invention solving the above mentioned technical problem are as follows:

A trench MOSFET with trench contact holes, characterized in that the MOSFET comprises: an N type substrate, an N type epitaxial layer formed on the N type substrate; a P well region formed on top of the N type epitaxial layer region; a source region formed on the P well region; an oxide layer covered on the source region; characterized in that, the MOSFET further comprises:

a plurality of trenches which traverse the source region and the P well region and contact the N type epitaxial layer region, a gate oxide layer and polysilicon being formed in the trenches;

a source contact hole which traverses the oxide layer and the source region and contact the P well region, wherein a titanium metal layer, a titanium nitride layer, and tungsten metal are sequentially deposited in the source contact hole;

a gate contact hole which traverses the oxide layer into one trench, wherein a titanium metal layer, a titanium nitride layer, and tungsten metal are sequentially deposited in the gate contact hole;

a P+ implanted region located in the P well region below the source contact hole; and a source electrode formed above the source contact hole and a gate electrode formed above the gate contact hole;

Wherein when said N type is replaced with P type, P is replaced with N; in other words, another technical solution for the trench MOSFET with trench contact holes in the present invention is as follows:

A trench MOSFET with trench contact holes, comprising: a P type substrate, a P type epitaxial layer formed on the P type substrate; an N well region formed on top of the P type epitaxial layer region; a source region formed on the N well region; an oxide layer covered on the source region; characterized in that, the MOSFET further comprises:

a plurality of trenches which traverse the source region and the N well region and contact the P type epitaxial layer region, a gate oxide layer and polysilicon being formed in the trenches;

a source contact hole which traverses the oxide layer and the source region and contact the N well region, wherein the source contact hole has a titanium metal layer, a titanium nitride layer, and tungsten metal sequentially;

a gate contact hole which traverses the oxide layer into the trenches, wherein the gate contact hole has a titanium metal layer, a titanium nitride layer, and tungsten metal sequentially;

an N+ implanted region located in the N well region below the source contact hole; and a source electrode formed above the source contact hole and a gate electrode formed above the gate contact hole.

Preferably, the N type or P type substrate is doped with N+ type or P+ type impurities having a electrical resistivity of 0.001-0.002 Ω·cm and a concentration of 3-4e19/cm$^3$; and the epitaxial layer has a thickness of 2.5-3.5 um and the epitaxial layer is doped with N− type or P− type ions having a electrical resistivity of 0.2-0.4 Ω·cm and a concentration of 1-2e16/cm$^3$.

Preferably, the trenches have a depth of 1.2-1.6 um and a width of 0.4-0.6 um; the gate oxide layer has a thickness of 200-400 A; and the N+ or P+ doped polysilicon has a thickness of 11000-12000 A.

Preferably, the source contact hole has a width of 0.3-0.4 um and a depth of 3500 A.

Preferably, the titanium metal and the titanium nitride sequentially deposited in the source contact hole and the gate contact hole have a respective thickness of 300 A and 1000 A.

Preferably, the source electrode and the gate electrode are metal AlCu with a thickness of 3-4 um.

In the present invention a method for producing the above mentioned trench MOSFET with trench contact holes is also provided, characterized in that, the method comprises the steps of:

Step 1: providing an N type substrate and forming an N type epitaxial layer on the N type substrate;

Step 2: etching a plurality of trenches which traverse the source region and the P well region and contact the N type epitaxial layer region, wherein a gate oxide layer and polysilicon are formed in the trenches;

Step 3: forming a P well region on top of the N type epitaxial layer region;

Step 4: forming a source region on the P well region;

Step 5: depositing an oxide layer on the source region and polishing the surface thereof;

Step 6: etching a source contact hole in the source region, wherein said source contact hole traverses the oxide layer and the source region and contacts the P well region;

Step 7: etching a gate contact hole in one trench, wherein the gate contact hole traverses the oxide layer deep into the trench;

Step 8: forming a P+ implanted region below the source contact hole;

Step 9: depositing titanium metal and titanium nitride sequentially in the source contact hole and the gate contact hole and performing thermal annealing followed by filling tungsten metal and grinding the surface of the tungsten metal; and Step 10: forming a source electrode and a gate electrode above the source contact hole and the gate contact hole, respectively;

Wherein when said N type is replaced with P type, P is replaced with N; in other words, another technical solution for the method for producing the trench MOSFET with trench contact holes in the present invention is as follows:

A method for producing the trench MOSFET with trench type contact holes in the present invention, characterized in that, the method comprises the steps of:

Step 1: providing a P type substrate and forming a P type epitaxial layer on the P type substrate;

Step 2: etching a plurality of trenches which traverse the source region and the N well region and contact the P type epitaxial layer region through, wherein a gate oxide layer and polysilicon are formed in the trenches;

Step 3: forming an N well region on top of the P type epitaxial layer region;

Step 4: forming a source region on the N well region;

Step 5: depositing an oxide layer on the source region and polishing the surface thereof;

Step 6: etching a source contact hole in the source region, wherein said source contact hole traverses the oxide layer and the source region and contacts the N well region;

Step 7: etching a gate contact hole in one trench, wherein the gate contact hole traverses the oxide layer deep into the trench;

Step 8: forming an N+ implanted region below the source contact hole;

Step 9: depositing titanium metal and titanium nitride sequentially in the source contact hole and the gate contact hole and performing thermal annealing followed by filling tungsten metal and grinding the surface of the tungsten metal; and Step 10: forming a source electrode and a gate electrode above the source contact hole and the gate contact hole, respectively;

Preferably, the step of etching a plurality of trenches in Step 2 further comprises:

Step 21: forming a buffer oxide layer and a silicon nitride layer sequentially on the N type or P type epitaxial layer;

Step 22: removing the buffer oxide layer and the silicon nitride layer which are on both sides of the epitaxial layer and growing field oxide layers on said both sides from which the buffer oxide layer and the silicon nitride layer have been removed;

Step 23: etching trenches with a depth of 1.2-1.6 um and a width of 0.4-0.6 um;

Step 24: growing a sacrificial oxide layer on the etched trenches followed by the removal of the sacrificial oxide layer, rounding and smoothing edges and corners at the bottom and the top of the trenches, and after that, removing the silicon nitride layer;

Step 25: growing a gate oxide layer and filling the trenches with N+ or P+ doped polysilicon while making sure that the outside of the trenches remain no polysilicon.

Preferably, in Step 3, the P well or N well region is obtained by implanting boron ions or N type ions with a dose of 1-2e13/cm$^2$ and energy of 160-200 kev and then carrying out thermal redistribution.

Preferably, it is characterized in that in Step 4, the source region is formed by implanting arsenic ions or P type ions with a dose of 5-7e15/cm$^2$ and energy of 70-90 kev and then carrying out thermal annealing.

Preferably, it is characterized in that in Step 5, 3000 A PSG (Phosphor Silicate Glass) and 3000 A BPSG (boro-phospho-silicate-glass, BPSG) are deposited to form the oxide layer by using the plasma-enhanced chemical vapor deposition process and the surface thereof is polished by chemical mechanical polishing.

Preferably, in Step 6, the source contact hole is obtained by using dry etching.

Preferably, in Step 8, the P+ implanted region or N+ implanted region is obtained by implanting boron fluoride ions or N+ ions with a dose of 5-7e15/cm$^2$ and energy of 70-90 kev, Preferably, in Step 9, the plasma vapor deposition process is employed to deposit titanium metal and titanium nitride sequentially in the source contact hole and the gate contact hole respectively and performing thermal annealing followed by filling tungsten metal and grinding the surface of the tungsten metal by chemical mechanical polishing.

Preferably, in Step 10, after depositing metal AlCu with a thickness of 3-4 um, the source electrode and the gate electrode are obtained by using dry etching.

The present invention has positive and progressive effects as follows:

1. The etching steps are simplified and the trench manufacturing process are utilized to make sure that the source contact hole traverses source diffusion region to reach the well region, and thus, a desirable contact between the well region and the source block is ensured.

2. The mutual solubility between metals and silicon is effectively prevented and the breakdown of the junction is also prevented by using tungsten as a filling material and adding a barrier layer between silicon and tungsten.

DETAILED DESCRIPTION OF THE PREFERRED EMBODIMENTS

In the following description, preferred embodiments will be disclosed with the attached figures to illustrate the technical solutions of the present invention.

Embodiment 1

According to FIGS. 3-15, the detailed embodiment is now given below and numerous specific details are provided to make sure those who skilled in the art will more readily understand the structure features and functional features of the present invention, said detailed description is not to be construed as limiting the invention.

Figure 4:
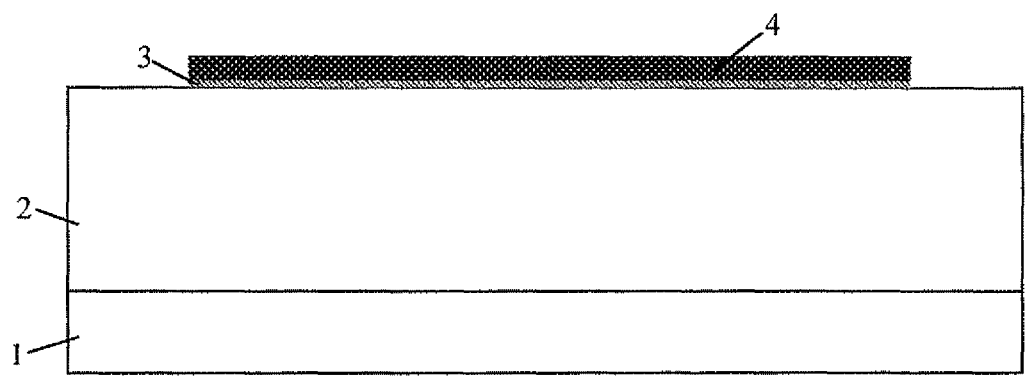
FIGS. 4 to 15 are schematic diagrams of each of processing steps for producing the trench MOSFET according to the present invention.

As shown in FIGS. 4-15, the production of the trench MOSFET in the present invention comprises the following processing steps:

Step 1: refer to FIG. 4, providing a N type substrate 1 and forming a N type epitaxial layer 2 on the N type substrate 1, wherein the substrate 1 is doped with As ions and said substrate 1 has a electrical resistivity of 0.001-0.002 Ω·cm and a concentration of 3-4e19/cm$^3$. The epitaxial layer is doped with N− ions and has a thickness of 2.5-3.5 um, the electrical resistivity of said epitaxial layer is 0.2-0.4 Ω·cm, and the concentration of said epitaxial layer is about 1-2e16/cm$^3$.

Figure 5:
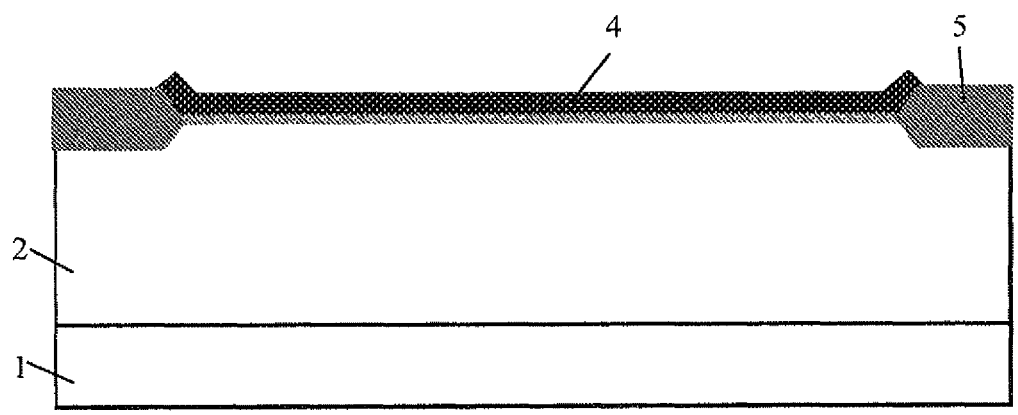
Figure 6:
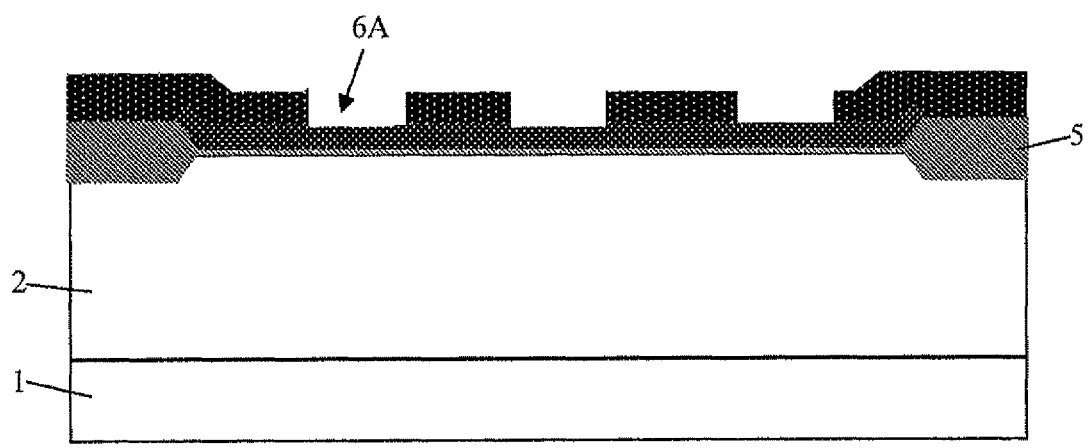
Figure 7A:
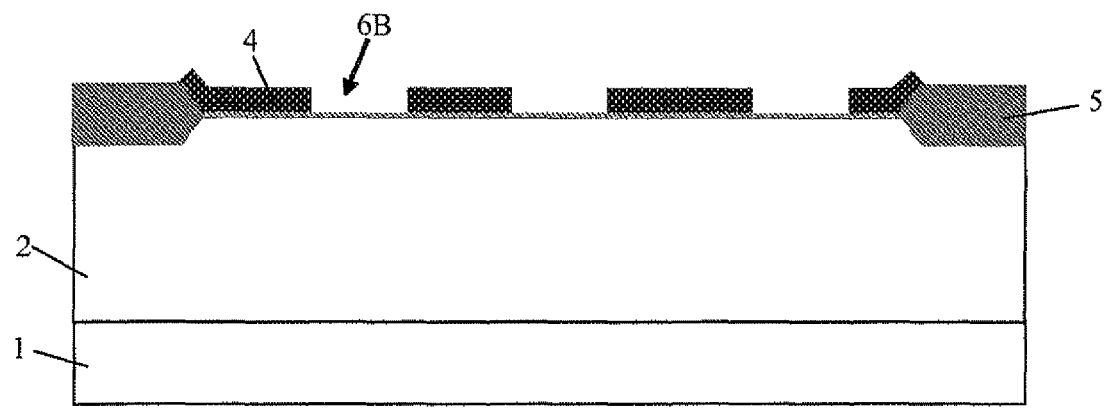
Figure 7B:
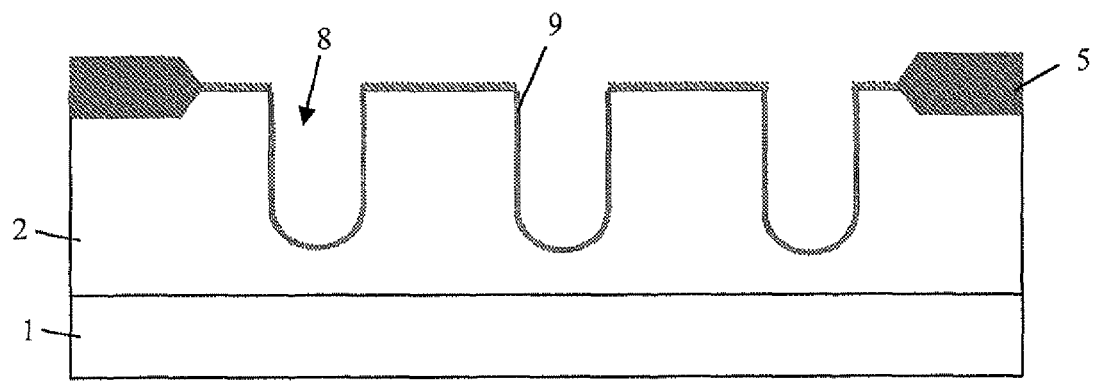
Figure 8:
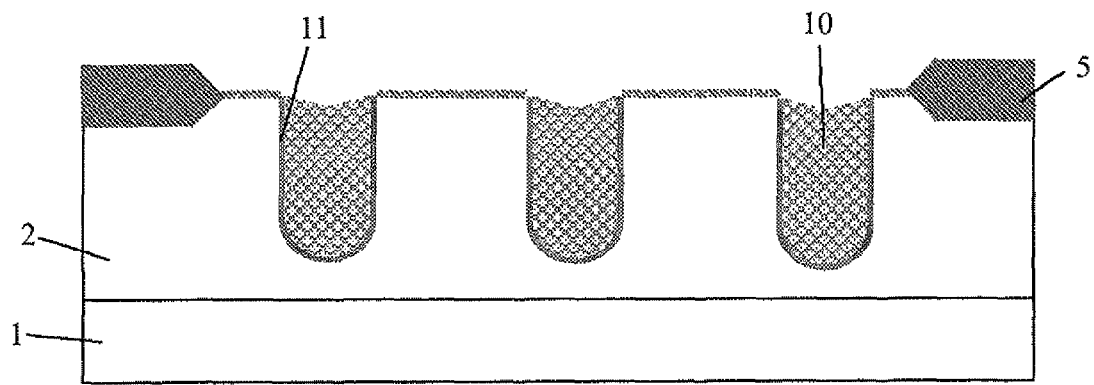
Figure 9:
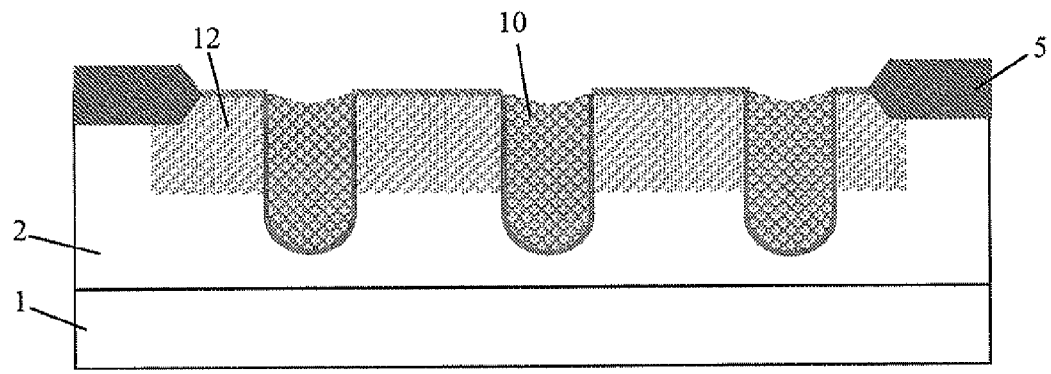

Step 2: refer to FIGS. 4-8, etching a plurality of trenches which traverse the source region and the P well region and contact the N type epitaxial layer region, wherein a gate oxide layer and polysilicon are formed in the trenches, said step 2 comprising the following detailed steps:

Step 21: refer to FIG. 4, forming a buffer oxide layer 3 with a thickness of 200-300 A and a silicon nitride layer 4 sequentially on the N type epitaxial layer 2, wherein the buffer oxide layer 3 is silica;

Step 22: refer to FIG. 5, removing the buffer oxide layer 3 and the silicon nitride layer 4 which are on both sides of the epitaxial layer, and growing field oxide layers 5 by using the thermal oxidation process on said both sides from which the buffer oxide layer and the silicon nitride layer have been removed;

Step 23: refer to FIGS. 6, 7a, and 7b, first, coating 2 um photoresist followed by exposure and development to make trench windows 6A, etching the silicon nitride layer below the trench windows 6A by using the plasma dry etching process to form a silicon nitride hard film layer 4 to be used in subsequent trench etching and further etching windows 6B, and then removing the photoresist to get the structure as shown in FIG. 7a, and then adopting the dry etching process to etch trenches 8 with a depth of about 1.2-1.6 um (preferably a depth of 1.4-1.6 um) and a width of 0.4-0.6 um;

Step 24: refer to FIG. 7b, growing a sacrificial oxide layer 9 with the thickness of 600 A-1000 A on the etched trenches 8 by using the thermal oxidation process, and then restoring silicon surface defects caused when etching the trenches 8 by using dry etching to remove the sacrificial oxide layer 9, which is beneficial for the growth of a high-quality gate oxide layer 11 in the subsequent step. After that, removing the silicon nitride layer after the restoration of the silicon surface defects;

Step 25: refer to FIG. 8, growing the gate oxide layer 11 with a thickness of 200-400 A by using the thermal oxidation process followed by filling the trenches 8 with N+ doped polysilicon of 11000-12000 A by using the low-pressure chemical vapor deposition process, employing the dry etching process to etch the polysilicon on the silicon wafer surface to make sure that the outside of the trench region remains no polysilicon, and then performing the thermal annealing of polysilicon;

Step 3: refer to FIG. 9, forming a P well region 12 on top of the N type epitaxial layer region, wherein the formation of the P well region is completed by implanting boron ions with a implanting dose of 1-2e13/cm$^2$ and energy of 160-200 kev.

Figure 10:
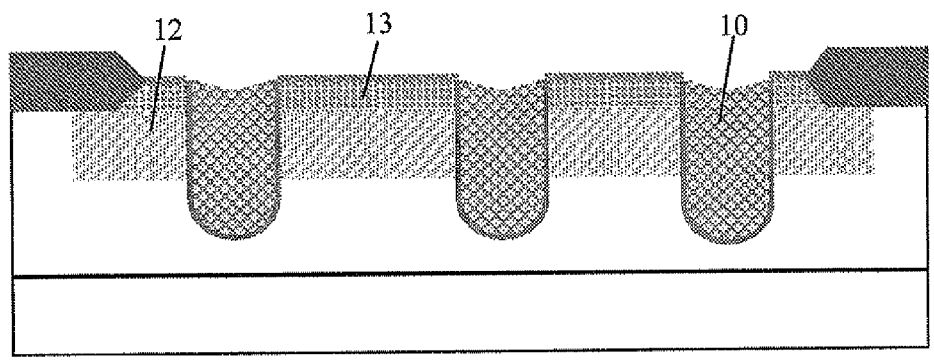
Figure 11:
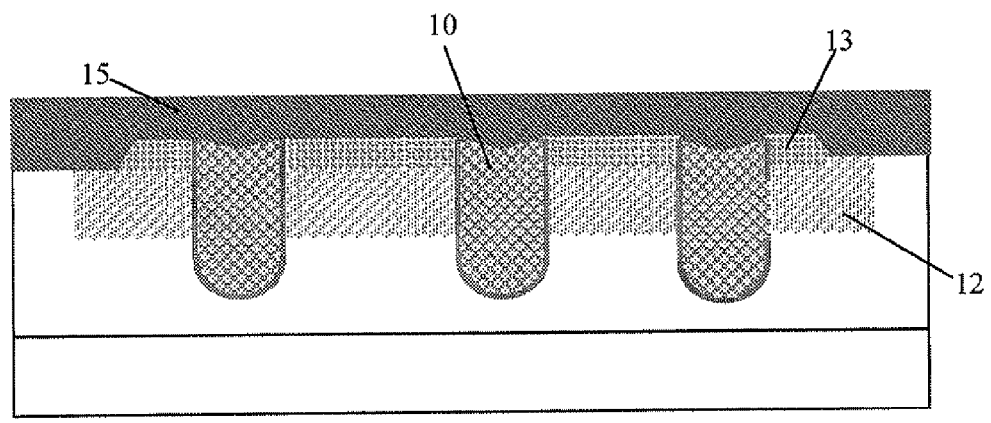
Figure 12:
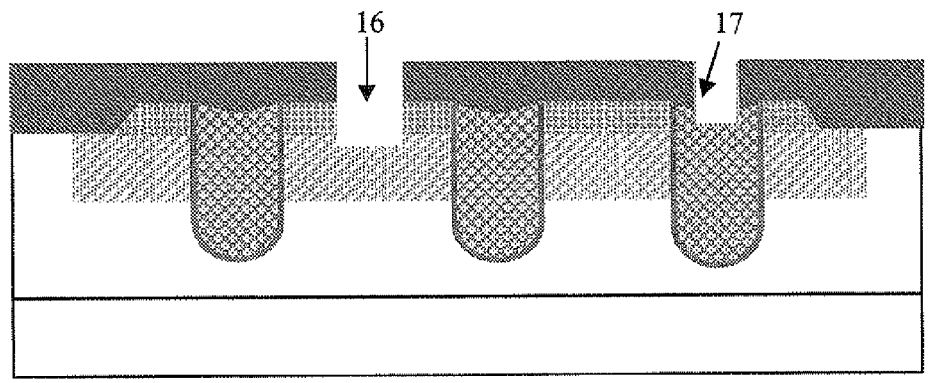
Figure 13:
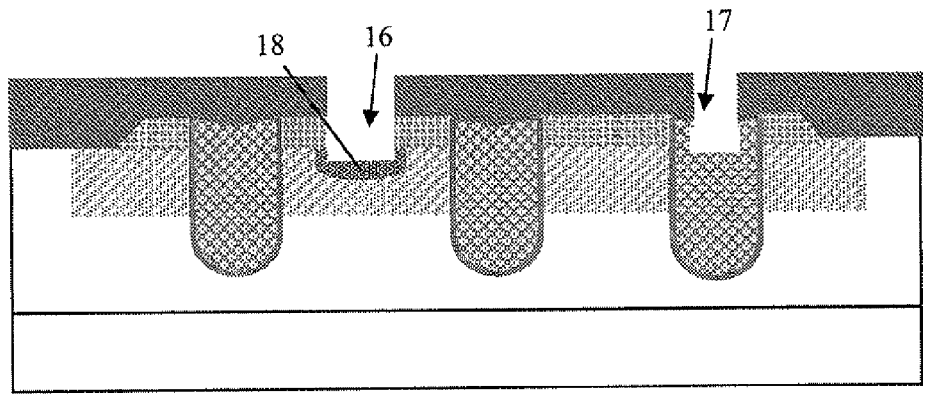
Figure 14:
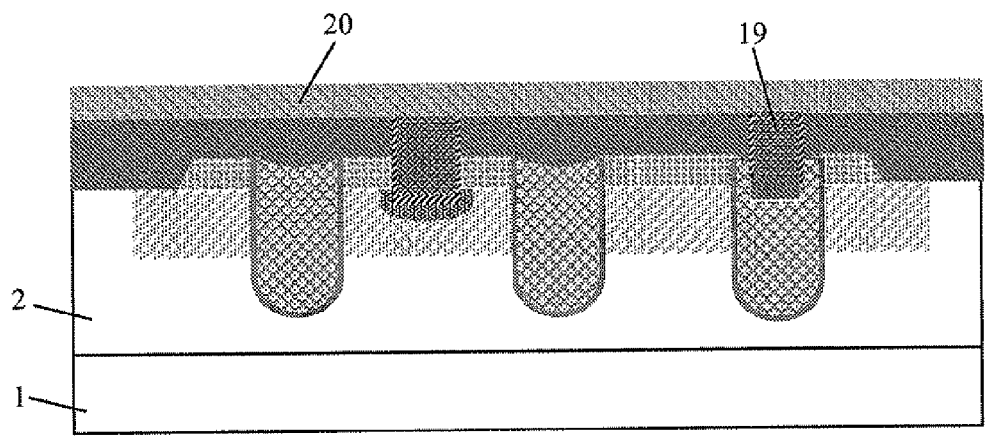
Figure 15:
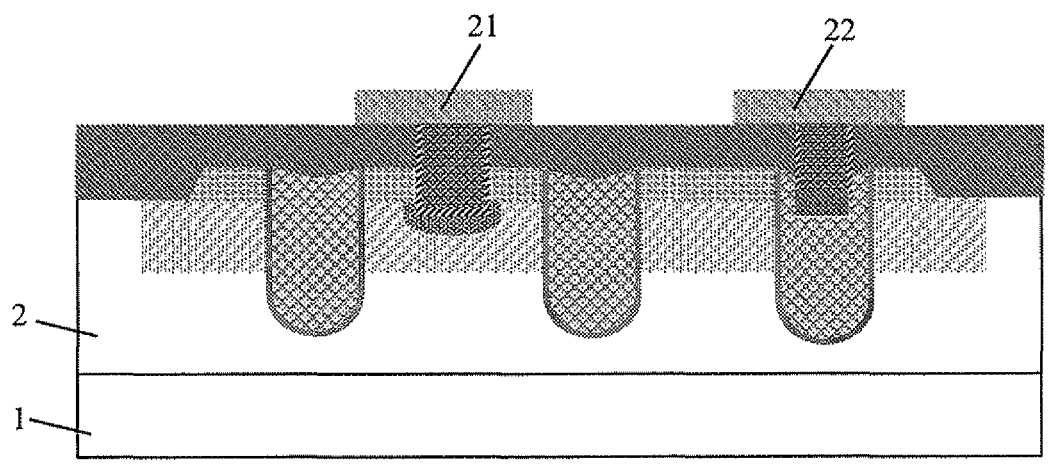

After the boron ions implanted, performing a thermal redistribution for 150 minutes with the temperature of 1150□;

Step 4: refer to FIG. 10, implanting N+ ions on top of the P well region 12 to form a source region 13, wherein in this embodiment, the source region is formed by implanting arsenic with a dose of 5-7e15/cm$^2$ and energy of 70-90 kev and after that, a thermal annealing treatment for 90 minutes with a temperature of 950° C. is performed;

Step 5: refer to FIG. 11, depositing an oxide layer 15 on the source region 13 by using the plasma-enhanced chemical vapor deposition process and polishing the surface thereof through chemical mechanical polishing, wherein in this embodiment, 3000 A PSG (Phosphor Silicate Glass) and 3000 A BPSG (boro-phospho-silicate-glass, BPSG) are deposited to form the oxide layer;

Step 6: refer to FIG. 12, etching a source contact hole 16 in the source region 13, wherein the source contact hole 16 traverses the oxide layer and the source region to contact the P well region. The source contact hole is formed by dry etching and has a width of 0.3-0.4 um and a depth of 3500 A;

Step 7: refer to FIG. 12, etching a gate contact hole 17 in one trench, wherein the gate contact hole 17 traverses the oxide layer 15 deep into the trench 8;

Step 8: refer to FIG. 13, forming a P+ implanted region 18 below the source contact hole 16, wherein the P+ implanted region 18 is obtained by implanting boron fluoride ions with a dose of 5-7e15/cm$^2$ and energy of 70-90 Kev;

Step 9: refer to FIG. 14, employing the plasma vapor deposition process to deposit titanium metal with a thickness of 300 A and titanium nitride with a thickness of 1000 A sequentially in the source contact hole and the gate contact hole, performing a thermal annealing with a temperature 500° C. to form excellent low resistance compounds from titanium and silicon followed by filling tungsten metal 19, and grinding down the surface of the tungsten metal by chemical mechanical polishing;

Step 10: refer to FIGS. 14-15, based on Step 9, depositing metal AlCu 20 with a thickness of 3-4 um at a temperature of 300° C. followed by performing photolithography and then forming a source electrode 21 and a gate electrode 22 on the source contact hole and the gate contact hole by using dry etching, respectively.

As can be seen from the above description, the trench MOSFET with trench contact holes in the present invention comprises:

an N type substrate 1, an N type epitaxial layer 2 formed on the N type substrate 1;

a P well region 12 formed on top of the N type epitaxial layer 2 region;

a source region 13 formed on the P well region 12;

an oxide layer 15 covered on the source region 13;

a plurality of trenches 8 which traverse the source region 13 and the P well region 12 and contact the N type epitaxial layer 2 region, a gate oxide layer 11 and polysilicon 10 being formed in the trenches;

a source contact hole 16 which traverses the oxide layer 15 and the source region 13 and contacting the P well region, wherein a titanium metal layer, a titanium nitride layer, and tungsten metal 19 are sequentially deposited in the source contact hole;

a gate contact hole 17 which traverses the oxide layer 15 into one trench 8, wherein a titanium metal layer, a titanium nitride layer, and tungsten metal 19 are sequentially deposited in the gate contact hole;

a P+ implanted region 18 located in the P well region below the source contact hole 16; and, a source electrode 21 formed above the source contact hole 16 and a gate electrode 22 formed above the gate contact hole 17.

Embodiment 2

This embodiment adopts the P-type semiconductor. The principle and processing steps thereof are both the same as Embodiment 1 and the differences are as follows: the substrate adopted is a P-type substrate, the epitaxial layer grown on the substrate is a P-type epitaxial layer, the well on top of the epitaxial layer is a N well region, the source region on the N well region is a P+ type source region, in-situ P+ doped polysilicon is in the trenches, and the implanted region below trench contact holes is a N+ implanted region. Besides, the oxide layer and metals filled in the trench contact holes are all the same as those in Embodiment 1.

Figure 1:
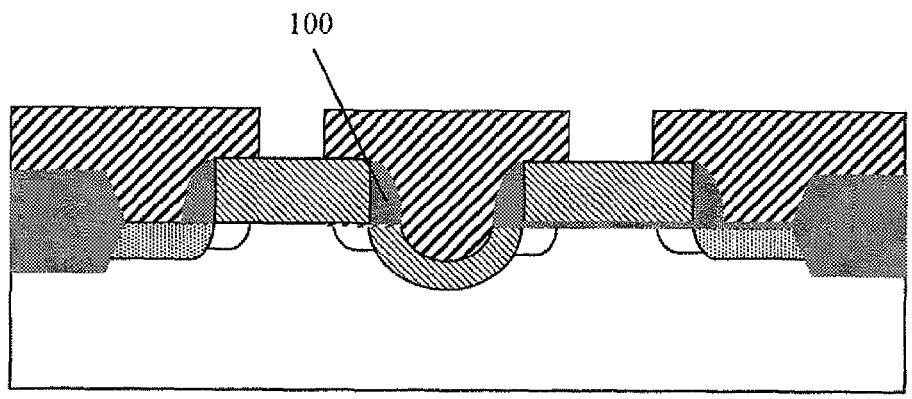
FIG. 1 is a schematic diagram of the conventional plane contact holes.
Figure 2:
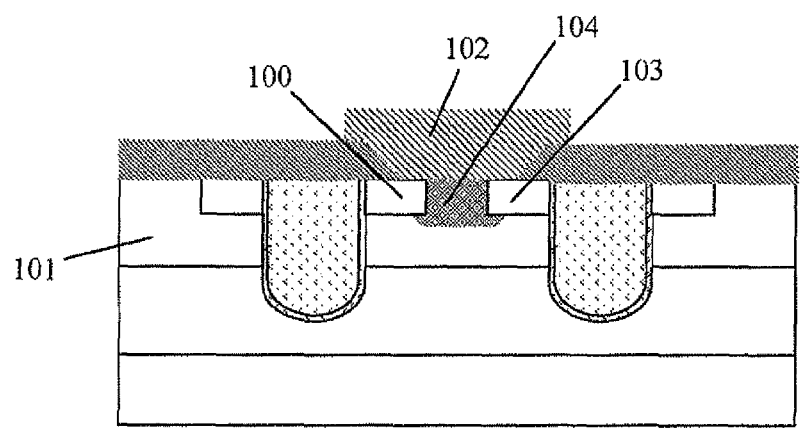
FIG. 2 is a schematic diagram of the prior MOSFET suitable for large unit cell pitches.
Figure 3:
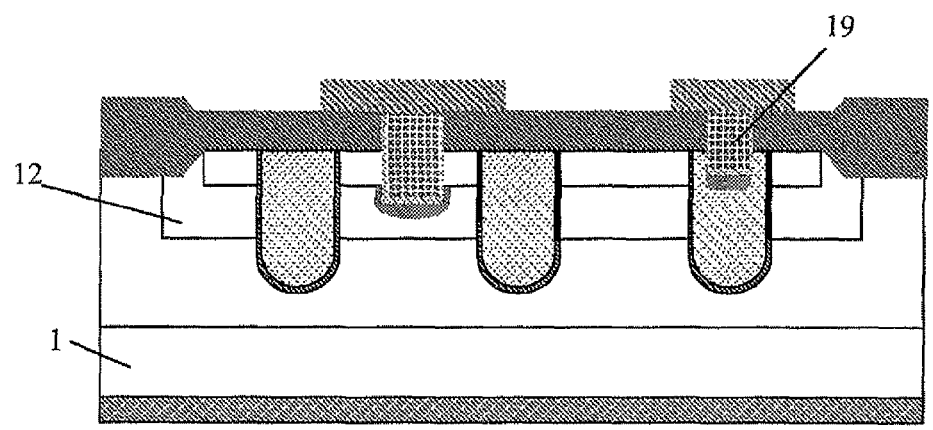
FIG. 3 is a schematic diagram of the trench MOSFET according to the present invention.

The present invention is based on four steps of etching process, wherein the trench contact hole process is employed to enable the contact holes to traverse the source block and the P well region to reach the substrate region, namely, the drain region, in which way, after the posterior metal process, a desirable contact can be ensured to form between the P well and the source block (refer to FIG. 3). In addition, a Ti/TiN barrier layer is added between the metal and the silicon in the present invention for the following reasons: when a trench MOSFET with small unit cell pitches is designed, the deep/width ratio of the trench hole will become larger in the case that the sizes of contact holes are smaller than 0.4 um; in the present invention tungsten is used as contact hole filling material rather than Al because that the filling characteristic of tungsten is better than that of Al, and a barrier layer of titanium metal and titanium nitride (Ti/TiN) is added between tungsten and silicon to form a titanium metal/titanium nitride/tungsten structure, in which way, titanium and silicon will form a layer of TiSi2 with an extremely low resistivity, wherein TiN can be used as a barrier layer to effectively prevent the mutual solubility between the metal and silicon, and thus a breakdown of junction can be prevented. After the edges and surfaces are ground by using the chemical mechanical polishing process, low-temperature metal AlCu is deposited. This type of process can match with the prior 0.35 um process well.

Although some preferable embodiments of the present invention have been detailed above, a person skilled in the art should understand that all these are intended as illustrations. Various modifications and amendments may occur to those skilled in the art without departing from the true spirit and scope of the invention as defined by the appended claims.

The invention claimed is:

1. A method for producing a trench MOSFET with trench contact holes,
   the MOSFET comprising: an N type substrate, an N type epitaxial layer formed on the N type substrate; a P well region formed on top of the N type epitaxial layer region; a source region formed on the P well region; an oxide layer covered on the source region; wherein the MOSFET further comprises:
   a plurality of trenches which traverse the source region and the P well region and contact the N type epitaxial layer, a gate oxide layer and polysilicon being formed in the trenches;
   a source contact hole which traverses the oxide layer and the source region and contacts the P well region, wherein the source contact hole has a titanium metal layer, a titanium nitride layer, and tungsten metal sequentially;

a gate contact hole which traverses the oxide layer into the trenches, wherein the gate contact hole has a titanium metal layer, a titanium nitride layer, and tungsten metal sequentially;

a P+ implanted region located in the P well region below the source contact hole; and a source electrode formed above the source contact hole and a gate electrode formed above the gate contact hole;

wherein when said N type is replaced with P type, P is replaced with N, the method comprising the steps of:

Step 1: providing an N type substrate and forming an N type epitaxial layer on the N type substrate;

Step 2: etching a plurality of trenches which traverse the source region and the P well region and contact the N type epitaxial layer region, wherein a gate oxide layer and polysilicon are formed in the trenches;

Step 3: forming a P well region on top of the N type epitaxial layer region;

Step 4: forming a source region on the P well region;

Step 5: depositing an oxide layer on the source region and polishing the surface thereof;

Step 6: etching a source contact hole in the source region, wherein said source contact hole traverses the oxide layer and the source region and contacts the P well region;

Step 7: etching a gate contact hole in one trench, wherein the gate contact hole traverses through the oxide layer deep into the trench;

Step 8: forming a P+ implanted region below the source contact hole;

Step 9: depositing titanium metal and titanium nitride sequentially in the source contact hole and performing thermal annealing followed by filling tungsten metal in the source contact hole and grinding the surface of the tungsten metal in the source contact hole; and depositing titanium metal and titanium nitride sequentially in the gate contact hole and performing thermal annealing followed by filling tungsten metal in the gate contact hole and grinding the surface of the tungsten metal in the gate contact hole; and Step 10: forming a source electrode and a gate electrode above the source contact hole and the gate contact hole, respectively;

wherein when said N type is replaced with P type, P is replaced with N, wherein the step etching a plurality of trenches in Step 2 further comprises:

Step 21: forming a buffer oxide layer and a silicon nitride layer sequentially on the N type or P type epitaxial layer;

Step 22: removing the buffer oxide layer and the silicon nitride layer which are on both sides of the epitaxial layer and growing field oxide layers on said both sides from which the buffer oxide layer and the silicon nitride layer have been removed;

Step 23: etching trenches each with a depth of 1.2-1.6 um and a width of 0.4-0.6 um;

Step 24: growing a sacrificial oxide layer on the etched trenches followed by the removal of the sacrificial oxide layer, rounding and smoothing edges and corners at the bottom and the top of the trenches, and removing the silicon nitride layer;

Step 25: growing a gate oxide layer and filling the trenches with N+ or P+ doped polysilicon and making the outside of the trenches free of polysilicon remains.

2. The method for producing the trench MOSFET with trench contact holes according to claim 1, wherein in Step 3, the P well or N well region is obtained by implanting boron ions or N type ions with a dose of $1\text{-}2e13/cm^2$ and energy of 160-200 kev and then carrying out thermal redistribution.

3. The method for producing the trench MOSFET with trench contact holes according to claim 1, wherein in Step 4, the source region is formed by implanting arsenic ions or P type ions with a dose of $5\text{-}7e15/cm^2$ and energy of 70-90 kev and then carrying out thermal annealing.

4. The method for producing the trench MOSFET with trench contact holes according to claim 1, wherein in Step 5, 3000 A PSG and 3000 A BPSG are deposited to form the oxide layer by using the plasma-enhanced chemical vapor deposition process and the surface thereof is polished by chemical mechanical polishing.

5. The method for producing the trench MOSFET with trench contact holes according to claim 1, wherein in Step 6, the source contact hole is obtained by using dry etching.

6. The method for producing the trench MOSFET with trench contact holes according to claim 1, wherein in Step 8, the P+ implanted region or N+ implanted region is obtained by implanting boron fluoride ions or N+ ions with a dose of $5\text{-}7e15/cm^2$ and energy of 70-90 Kev.

7. The method for producing the trench MOSFET with trench contact holes according to claim 1, wherein in Step 9, the plasma vapor deposition process is employed to deposit titanium metal and titanium nitride sequentially in the source contact hole and the gate contact hole respectively and performing thermal annealing followed by filling tungsten metal and grinding the surface of the tungsten metal by chemical mechanical polishing.

8. The method for producing the trench MOSFET with trench contact holes according to claim 1, wherein in Step 10, after depositing metal AlCu with a thickness of 3-4 μm, the source electrode and the gate electrode are obtained by using dry etching.

* * * * *